United States Patent [19]

Norton et al.

[11] 4,128,897

[45] Dec. 5, 1978

[54] ARCHIVAL MEMORY MEDIA AND METHOD FOR INFORMATION RECORDING THEREON

[75] Inventors: James F. Norton, Alplaus; Harold G. Parks, Scotia; George E. Possin, Schenectady, all of N.Y.

[73] Assignee: General Electric Company, Schenectady, N.Y.

[21] Appl. No.: 780,175

[22] Filed: Mar. 22, 1977

[51] Int. Cl.² .................... G11C 11/42; G11C 17/06
[52] U.S. Cl. ................................. 365/118; 29/576 B;
29/590; 148/185; 219/121 EM; 219/121 LM;
357/29; 365/103; 365/114
[58] Field of Search ................. 340/173 CR, 173 LS;
346/76 R, 76 L; 357/61, 63, 45, 90; 219/121 L,
121 LM, 121 EB, 121 EM; 365/118, 217, 115,
114, 112, 106, 128, 105

[56] References Cited

U.S. PATENT DOCUMENTS

| | | | |
|---|---|---|---|
| 3,599,181 | 9/1971 | Dearnaley | 340/173 CR |
| 3,761,895 | 10/1973 | Ellis et al. | 340/173 LS |
| 3,975,756 | 9/1976 | Lanigan et al. | 357/63 |
| 4,064,495 | 12/1977 | Kirkpatrick et al. | 365/118 X |
| 4,081,794 | 3/1978 | Parks et al. | 365/118 |

*Primary Examiner*—Bernard Konick
*Assistant Examiner*—Donald McElheny
*Attorney, Agent, or Firm*—Geoffrey H. Krauss; Joseph T. Cohen; Marvin Snyder

[57] ABSTRACT

Binary information is stored in a semiconductor archival memory medium by formation of a region of an alloy, of the semiconductor material and a non-doping material, at each of a plurality of potential memory sites at which a first binary value of information is to be stored, with the remaining data sites being devoid of the alloyed region to store the remaining value of binary data. Methods for writing the formation of the alloyed region, and reading the information value stored at each memory site, are also disclosed.

14 Claims, 1 Drawing Figure

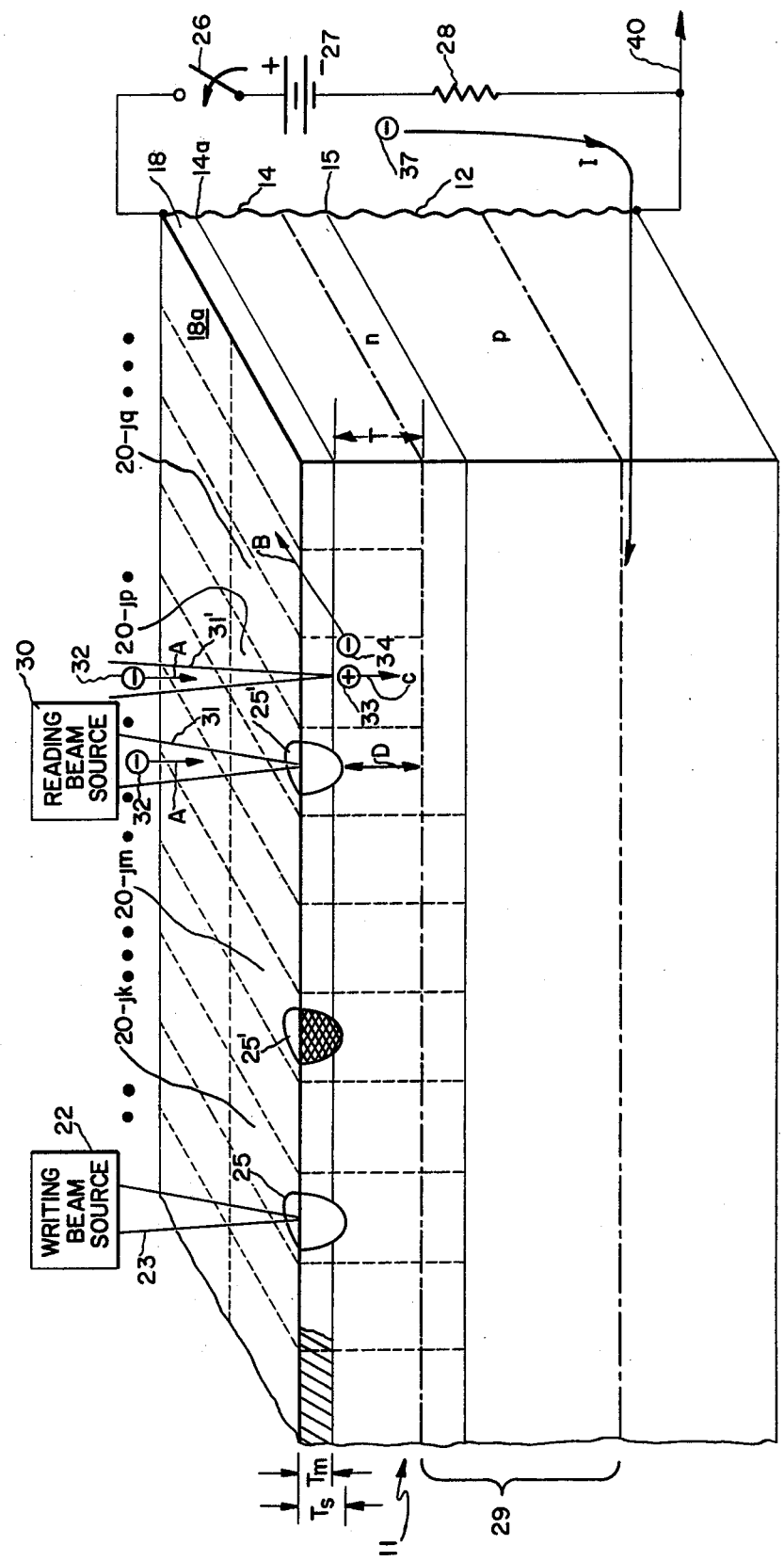

ARCHIVAL MEMORY MEDIA AND METHOD FOR INFORMATION RECORDING THEREON

The invention herein described was made in the course of or under a contract or subcontract thereunder, with the Department of the Air Force.

BACKGROUND OF THE INVENTION

The present invention relates to archival memory media, and more particularly, to a novel memory target in which a first value of binary information is stored in a region containing an alloy of the semiconductor material and a non-doping material.

The requirements of modern data processing often dictate that non-volatile data storage means of vast capacity be utilized. Archival memories, in which data is substantially permanently written and subsequently capable only of being read from the memory, is relatively easily achieved for those applications where a large quantity of identically programmed devices (each having the same identical data patterns stored therein) must be fabricated. Large memories each capable of storing a unique data pattern typically containing upwards of $10^9$ bits of binary information per device are relatively difficult and costly to fabricate. Typically, such a large-scale archival memory would be fabricated by introducing dopant materials into a semiconductor structure, with dopants of opposite polarity being introduced in the semiconductor at storage sites in which opposite binary values of information are to be stored. Memory media characterized by low fabrication cost and rapid programming, i.e. into which data can be written at rates on the order of $10^6$ bits/second, should also not require that a plurality of fabrication steps be needed to change the types and levels of dopants in a semiconductor memory target, which steps may often require relatively long time intervals for the completion thereof, whereby the speed of writing data into the memory target is relatively low.

BRIEF DESCRIPTION OF THE INVENTION

In accordance with the invention, an archival memory target in which information is recorded by alloy formation, comprises a substrate of a first polarity-type semiconductor material, upon a surface of which is sequentially fabricated a layer of the opposite polarity-type semiconductor and a thin overlayer of a non-doping material, i.e. a material which does not introduce dopants, of either polarity-type, into the lattice of the chosen semiconductor material. Data of a first binary value is stored in the target by heating the non-dopant material and the underlying opposite-polarity-type semiconductor material at each site, in a two-dimensional array of possible memory storage sites designated upon the surface of the target plane, until the local temperature thereat exceeds the temperature at which the non-doping material and the semiconductor material form a eutectic alloy; the eutectic region is then allowed to cool to form a region containing an alloy of the semiconductor and non-dopant material. The remaining possible data storage sites are devoid of the alloy region, for storage of a bit of information thereat having the remaining binary value. Data is read from the memory plane by scanning a finely focussed electron beam sequentially to each storage site, whereby those sites devoid of an alloyed region have electron-hole pairs formed in the semiconductor layer thereof with the holes being allowed to migrate across a depletion region formed by back biasing the junction between the semiconductor substrate and semiconductor layer, to induce a flow of current in an external load. Impingement of the electron beam on the alloyed region generates a relatively small number of electron-hole pairs, whereby holes are not contributed to the valance band and electrons are not contributed to the conduction band of the underlying semiconductor, with the holes and electrons recombining instead in the alloy region thereby providing a minimum current across the target depletion region and through the external load.

Preferred non-doping materials include gold and silver for use with both germanium and silicon semiconductor materials.

Accordingly, it is one object of the present invention to provide a novel memory target plane in which data of a first binary value is stored by formation of a region of an alloy of the semiconductor material and a non-doping material.

It is another object of the present invention to provide a method for writing a first value of binary information into each of a selected plurality of data storage sites in a memory target plane by formation of alloy regions at each of a chosen multiplicity of such sites.

These and other objects of the present invention will become apparent upon consideration of the following detailed description and the drawing.

BRIEF DESCRIPTION OF THE DRAWINGS

The sole FIGURE is a sectional perspective view of a memory target plane in which information is recorded by alloy formation in accordance with the principles of the present invention.

DETAILED DESCRIPTION OF THE INVENTION

Referring now to the sole FIGURE, an archival memory target 11 comprises a substrate 12 of a first polarity-type semiconductor material, e.g. p-type silicon, upon one surface of which is fabricated a layer 14 of the same semiconductor material but having the opposite polarity-type dopants, e.g. n-type silicon. A thin layer 18 of a non-doping material, i.e. a material which substantially does not provide either polarity-type dopant to the semiconductor or which, if dopants are provided thereby to the semiconductor lattice, introduces energy levels in the semiconductor which are so deep as to be of relatively minimum usage in contributing holes to the valance band or electrons to the conduction band of the semiconductor, is fabricated to a thickness $T_m$ upon that surface 14a of the semiconductor layer furthest from the junction 15 formed between the layer 14 and the first polarity-type-doped substrate 12.

The free surface 18a of the non-dopant material layer may be considered to have a two-dimensional array of possible data storage sites 20 thereon. Each of data storage sites 20 is thus capable of storing one bit of binary information thereat; writing of data into the memory and reading of data subsequently therefrom will be described with reference to several data storage sites in the j-th row and in the k-th through q-th columns thereof, and thus having cell designations of 20-jk to 20-jq, sequentially.

A bit of data is written into memory target 11 by means of a writing beam source 22 producing a focussed beam 23 of high-energy particles (photons, electrons and the like) accelerated to a desired energy. The beam impinges upon top layer 18 at substantially the center of each storage site 20, e.g. site 20-jk, at which a first binary value, e.g. binary "one", of information is to be stored. Beam 23 induces sufficient energy into layer 18 and a portion of the underlying semiconductor layer 14 to raise the temperature of a region 25 about the beam impingement point to be greater than the eutectic temperature of an alloy of the chosen semiconductor material and the chosen non-dopant material, but less than the melting temperature of the non-dopant material of top layer 18. Beam writing source 22 may be a laser or a source of an electron beam and the like, selected to impart the required heating energy to the eutectic region 25. In one preferred embodiment wherein top layer 18 is fabricated of gold and the semiconductor material is silicon, a eutectic comprised of 30% gold and 70% silicon is formed by locally heating each region 25, to a depth $T_s$ (greater than $T_m$, the thickness of the overlayer) below top surface 18a, to a temperature greater than 577° C. (the eutectic temperature of the aforementioned gold-silicon alloy) and less than 1063° C. (the melting temperature of gold). Typical values of $T_m$ and $T_s$ are on the order of 1000Å and 1300Å, respectively.

After formation of the eutectic by heating, beam 23 is removed from region 25, either by modulation to an "off" condition or by physical movement to other storage sites 20, and the eutectic is allowed to solidify in a region 25', e.g. as at site 20-jm. The writing beam source is sequentially moved along each row of potential storage sites 20 and the beam is caused to impinge only upon those of sites 20 at which a solidified alloy region 25' is desired; after each row of sites is "scanned", the source 22 is moved to the next adjacent unwritten row and "scanned" along that row until the entire two-dimensional array, or that portion of the array to be written, has been traversed. Thus, some of the multiplicity of sites, e.g. 20-jp, contain the solidified alloy region and others of the sites, e.g. 20-jq, are devoid of alloy regions.

The information stored in memory target plane 11 is read by means of a reading beam source 30 producing a finely focussed beam of electrons 32 accelerated in direction A to typical energies on the order of 2-2.5 KeV. Source 30 is moved to cause beam 31 to sequentially impinge upon each of the sequential data sites along a row, before being scanned along a next adjacent row to recover the data stored therein. Prior to scanning the electron beam across target surface 18a, a switch means 26 is closed to couple a potential source 27 in series with a load resistor 28 between conductive overlayer 18 and a contact on the surface of substrate 12 furthest therefrom. The polarity and magnitude of potential source 27 are selected to cause a depletion region 29 to be formed about junction 15 between semiconductor layer 14 and semiconductor substrate 12. The level of dopants in semiconductor layer 14 relative to the doping level in semiconductor substrate 12 is selected to cause depletion region 29 to extend a shorter distance into layer 14 and a greater distance into layer 12, whereby a distance T separates the top semiconductor layer surface 14a from the nearest edge of depletion region 29. Thus, a small distance D separates the closest points of alloy region 25' and depletion region 29 (where D is less than T) and D is chosen to be as small as practicable, typically on the order of several hundreds of Angstroms.

An electron beam 31 impinging upon a data site devoid of an alloyed region, e.g. 20-jq, will cause electrons 32 to generate pairs of holes 33 and electrons 34 in semiconductor layer 14 above depletion region 29. Electrons 34 diffuse in the direction of arrow B, away from depletion region 29 and toward the positive terminal of potential source 27, while holes 33 diffuse, in the direction of arrow C, toward depletion region 29 for collection and combination with electrons 37 furnished by the negative electrode of potential source 27. The movement of electrons 37, for recombination with holes 33, causes a relatively large current I to flow through load resistance 28 whereby a discernible signal of a first magnitude appears at a memory plane output 40.

The presence of alloy region 25' at a written data site, e.g. 20-jp, substantially prevents formation of electron-hole pairs in the underlying semiconductor layer 14. The relatively few electron-hole pairs present are generated within the alloy region and the electrons and holes thereof rapidly recombine with each other, to substantially prevent diffusion of holes towards depletion region 29. A relatively low magnitude of current I is drawn from source 27 through load resistance 28, whereby a second discernible signal, differing in magnitude from the first signal, appears at the memory output lead 40. Thus, the differing relative magnitudes associated with different binary bit values, as stored at sites respectively including and devoid of an alloy region 25', are rapidly read from the memory plane as the electron beam 31 is rapidly scanned along a row of data storage sites 20.

It should be understood that any semiconductor material may be utilized to form target plane 11 and may be used in conjunction with any non-doping material capable of forming a eutectic alloy therewith. Similarly, it should be understood that the above-mentioned electron beam energies are by way of illustration only and that beams of greater or lesser energy may be utilized to produce respectively greater or lesser load currents by production of greater or lesser numbers of electron-hole pairs for recombination.

While the present invention has been described with reference to one preferred embodiment thereof, many variations and modifications will now become apparent to those skilled in the art. It is our intent, therefore, to be limited not by the present disclosure herein but only by the scope of the appending claims.

What is claimed is:

1. An archival memory target for essentially permanent storage of binary information, comprising:

a substrate of a semiconductor material containing doping impurities of a first polarity-type, said substrate having a first surface;

a layer of said semiconductor material containing doping impurities of an opposite polarity-type and fabricated upon said first surface of said substrate, said layer having a surface spaced from said first surface; and an overlayer of a conductive non-doping material capable of forming a eutectic alloy with said semiconductor material, said overlayer being fabricated directly upon said surface of said semiconductor layer and having a two-dimensional array of possible data storage sites assigned thereto;

a region of an alloy of said semiconductor and non-doping materials formed in a portion of the thickness of said semiconductor layer at each of said data storage sites at which a bit of information having a first binary value is non-erasably stored;

the remaining data storage sites being devoid of an alloy region to store thereat a bit of information having the remaining binary value.

2. A memory target as set forth in claim 1, wherein said semiconductor material is selected from the group consisting of silicon and germanium.

3. A memory target as set forth in claim 1, wherein said non-doping material is selected from the group consisting of gold and silver.

4. A memory target as set forth in claim 1, wherein said semiconductor material is silicon and said non-doping material is gold.

5. A memory target as set forth in claim 4, wherein said alloy is a solidified eutectic consisting essentially of about 30% gold and about 70% silicon.

6. A memory target as set forth in claim 1, further comprising means coupled to said target for forming a depletion region in said substrate and said semiconductor layer about a junction therebetween.

7. A memory target as set forth in claim 6, wherein the depletion region and each alloy region are separated by a distance less than one micron.

8. A method for essentially permanently storing binary information, comprising the steps of:
 a. providing a target plane having a semiconductor layer of a first polarity-type fabricated upon a surface of a substrate of the same semiconductor material and of a remaining polarity-type;
 b. fabricating a layer of a conductive non-doping material directly upon a surface of the semiconductor layer furthest from the junction between the semiconductor layer and the substrate;
 c. assigning a two-dimensional array of possible data storage sites to the surfaces of the material layer;
 d. heating the material layer and a portion of the underlying semiconductor layer to form a eutectic of the materials thereof in a portion of the semiconductor layer only at each of the data storage sites at which a bit of information having a first binary value is to be non-erasably stored;
 e. solidifying the eutectic formed in step (d) to form a region of an alloy of the semiconductor and non-doping materials.

9. A method as set forth in claim 8, further comprising the steps of:
 f. reverse-biasing the junction between the semiconductor layer and the substrate to form a depletion region thereabout;
 g. directing a focussed beam of electrons sequentially at each of a plurality of data storage sites; and
 h. monitoring the current flow through the depletion region to read the value of the bit of information stored at each data storage site upon which the electron beam impinges.

10. A method as set forth in claim 8, wherein step (d) comprises the steps of:
 accelerating a multiplicity of particles;
 forming a beam of the accelerated particles; and
 directing the beam to impinge upon the material layer at a selected data storage site to cause local heating thereat.

11. A method as set forth in claim 10, further comprising the step of adjusting the energy of the beam to heat the local region to a desired depth into the semiconductor layer.

12. A method as set forth in claim 8, wherein the semiconductor material is selected from the group consisting of silicon and germanium.

13. A method as set forth in claim 12, wherein the non-doping material is selected from the group consisting of gold and silver.

14. A method as set forth in claim 8, wherein the semiconductor material is silicon, the non-doping material is gold, and an alloy consisting essentially of about 30% gold and about 70% silicon is formed in step (d) by heating to a temperature greater than 577° C. and less than 1063° C.

* * * * *